United States Patent [19]

Yoo

[11] Patent Number: 5,585,307
[45] Date of Patent: Dec. 17, 1996

[54] FORMING A SEMI-RECESSED METAL FOR BETTER EM AND PLANARIZATION USING A SILO MASK

[75] Inventor: Chue-San Yoo, Taipei, Taiwan

[73] Assignee: Taiwan Semiconductor Manufacturing Company Ltd., Hsin-chu, Taiwan

[21] Appl. No.: 394,941

[22] Filed: Feb. 27, 1995

[51] Int. Cl.$^6$ .................................................. H01L 21/28
[52] U.S. Cl. ........................ 437/187; 437/195; 437/228; 437/981
[58] Field of Search ..................... 437/187, 195, 437/228, 947, 981; 257/774

[56] References Cited

U.S. PATENT DOCUMENTS

| | | | |
|---|---|---|---|
| 4,789,648 | 12/1988 | Chow et al. | 437/195 |
| 4,931,410 | 6/1990 | Tokunaga et al. | 437/194 |
| 5,086,017 | 2/1992 | Lu | 437/194 |
| 5,441,916 | 8/1995 | Motonami | 437/187 |

FOREIGN PATENT DOCUMENTS

| | | |
|---|---|---|
| 380327 | 8/1990 | European Pat. Off. . |
| 4-307939 | 10/1992 | Japan . |
| 6-61354 | 3/1994 | Japan . |
| 6-97295 | 4/1994 | Japan . |

OTHER PUBLICATIONS

"Silicon Processing for the VLSI Era, vol. 1", S. Wolf, Lattice Press 1986, pp. 418–423, 477.

"Silicon Processing for the VLSI Era, vol. 2", S. Wolf, Lattice Press, 1990, p. 229.

*Primary Examiner*—John Niebling
*Assistant Examiner*—Thomas G. Bilodeau
*Attorney, Agent, or Firm*—George O. Saile; Rosemary L. S. Pike

[57] ABSTRACT

A new method of metallization for improved electromigration performance of an integrated circuit is described. An insulating layer is deposited overlying semiconductor device structures. A shallow trench is etched into the insulating layer where a conducting line is to be formed. A contact opening is etched through the insulating layer within the shallow trench to the underlying semiconductor device structures. A conducting layer is deposited overlying the insulating layer, within the shallow trench, and within the contact opening wherein the conducting layer is partially buried within the insulating layer within the shallow trench. Planarization is improved because of the reduced step height of the conducting layer. The improved planarization and reduced step height result in improved electromigration performance.

26 Claims, 4 Drawing Sheets

FORMING A SEMI-RECESSED METAL FOR BETTER EM AND PLANARIZATION USING A SILO MASK

BACKGROUND OF THE INVENTION

1. Field of the Invention

The invention relates to a metallization process for integrated circuit devices, and more particularly, to a metallization process with improved electromigration and improved step coverage, especially for sub-micron feature sizes in the fabrication of integrated circuits.

2. Description of the Prior Art

For sub-micron feature sizes, metal step coverage and planarization processes are very difficult to implement. Typically, an insulating layer of borophosphosilicate glass (BPSG) 12 or the like is deposited over semiconductor device structures in and on a semiconductor substrate 10, as shown in FIG. 1. A contact opening is etched through the insulating layer 12 to the underlying substrate. A metal layer 14 is sputtered into the contact opening, as illustrated in FIG. 2. As the contact size decreases, the contact aspect ratio (contact height/ width) increases. The high aspect ratio inhibits the sputtered metal from going into the hole resulting in poor step coverage. Planarization is poor because the conducting layers tend to shrink more aggressively in the horizontal direction than in the vertical direction resultting in a more severe topography to planarize.

Methods such as hot aluminum plugs, $O_3$ tetraethoxysilane (TEOS), and other planarization schemes have been used by workers in the art. It is desirable to solve the metal step coverage and planarization problems with the least effort.

U.S. Pat. No. 5,324,975 to Kumagai et al shows a typical contact and conductor line layout.

SUMMARY OF THE INVENTION

A principal object of the present invention is to provide an effective and very manufacturable method of metallization of an integrated circuit which will improve electromigration.

A further object of the present invention is to provide an effective and very manufacturable method of metallization of an integrated circuit which will improve step coverage and planarization.

In accordance with the objects of this invention a new method of metallization of an integrated circuit is achieved. Semiconductor device structures are fabricated in and on a semiconductor substrate. An insulating layer is deposited overlying the semiconductor device structures. A shallow trench is etched into the insulating layer where a conducting line is to be formed. A contact opening is etched through the insulating layer within the shallow trench to the underlying semiconductor device structures. A conducting layer is deposited overlying the insulating layer, within the shallow trench, and within the contact opening wherein the conducting layer is partially buried within the insulating layer within the shallow trench whereby planarization is improved because of the reduced step height of the conducting layer. The improved planarization and reduced step height result in improved electromigration performance.

BRIEF DESCRIPTION OF THE DRAWINGS

In the accompanying drawings forming a material part of this description, there is shown.

DESCRIPTION OF THE PREFERRED EMBODIMENTS

Figure 5:
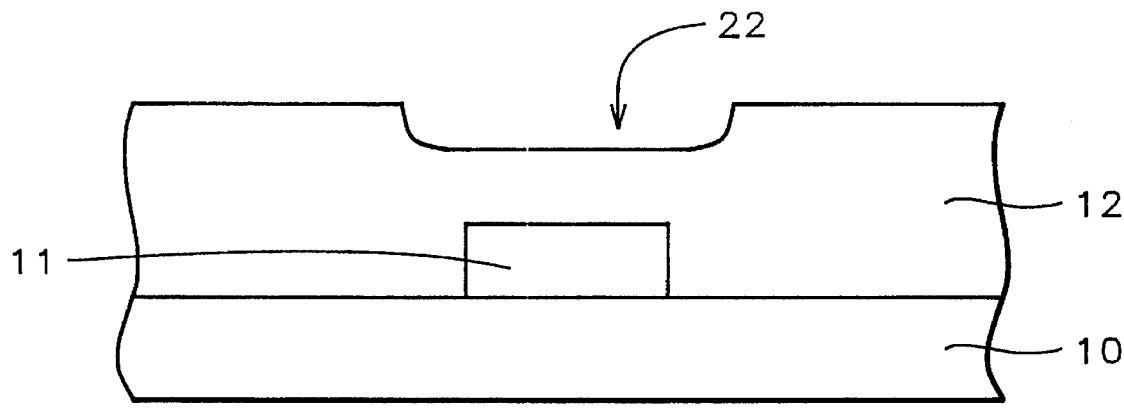
FIGS. 5, 6A, 6B, and 7 schematically illustrate in cross-sectional representation one preferred embodiment of this invention.

Referring now more particularly to FIG. 5, there is shown a portion of a partially completed integrated circuit. The semiconductor substrate 10 is preferably composed of monocrystalline silicon. Semiconductor device structures are formed in and on the semiconductor substrate. These may include polysilicon gate electrodes 11, source and drain regions, not shown, or the like. An insulating layer 12 of borophosphosilicate glass (BPSG), phosphosilicate glass (PSG) or the like is deposited over the semiconductor device structures.

It is desired to improve electromigration of the integrated circuit to be fabricated. Electromigration performance is better for metal lines on a flat surface than it is for metal lines on more severe topographies. The present invention provides a more flat topography.

The key feature of the present invention is the use of a "silo" mask to etch partially into the insulating layer 12 before depositing the conducting layer. In this way, the conducting layer will be partially buried within the insulating layer. Subsequent planarization will be improved because of the reduced step height of the conducting layer. Step coverage of the conducting layer will be improved because the trench formation for the conducting layer also etches down the contact area by a few thousand Angstroms, hence reducing the contact aspect ratio.

Figure 1:
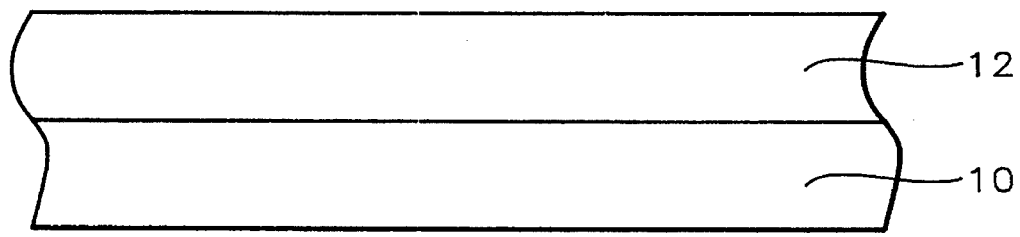
FIGS. 1 and 2 schematically illustrate in cross-sectional representation the process of the prior art.
Figure 2:
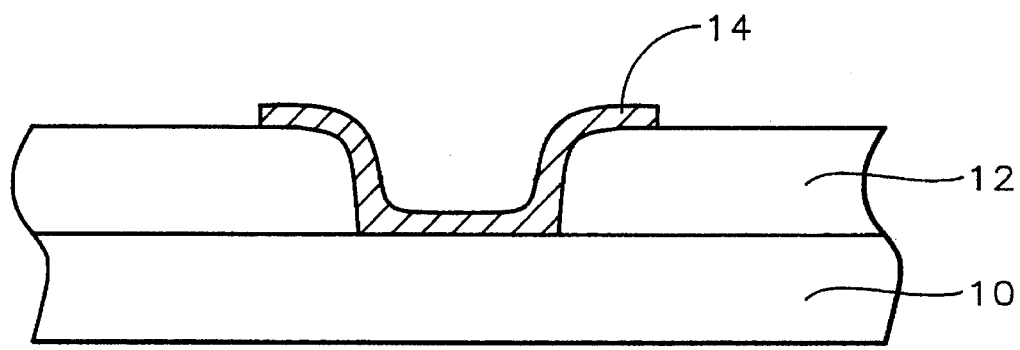
Figure 3:
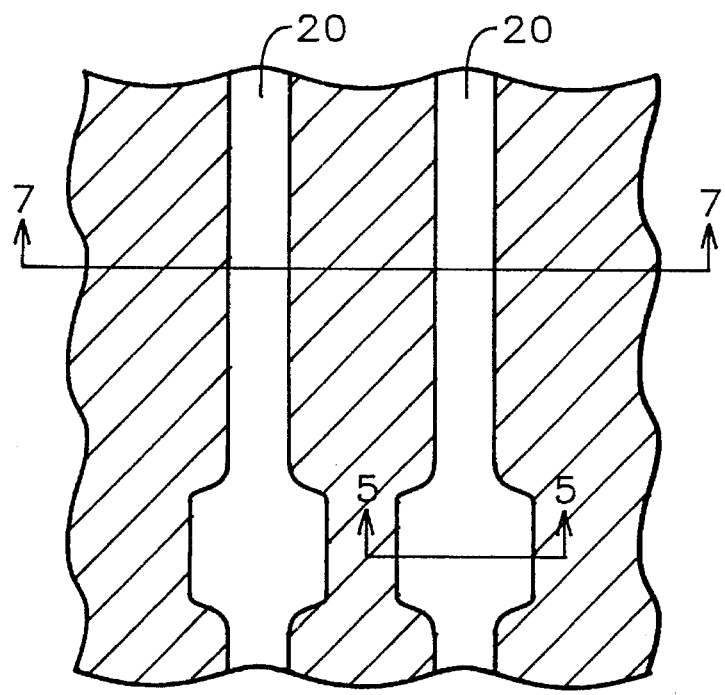
FIG. 3 schematically illustrates a top view of the reversed-tone modification of a metal mask of the present invention.
Figure 4:
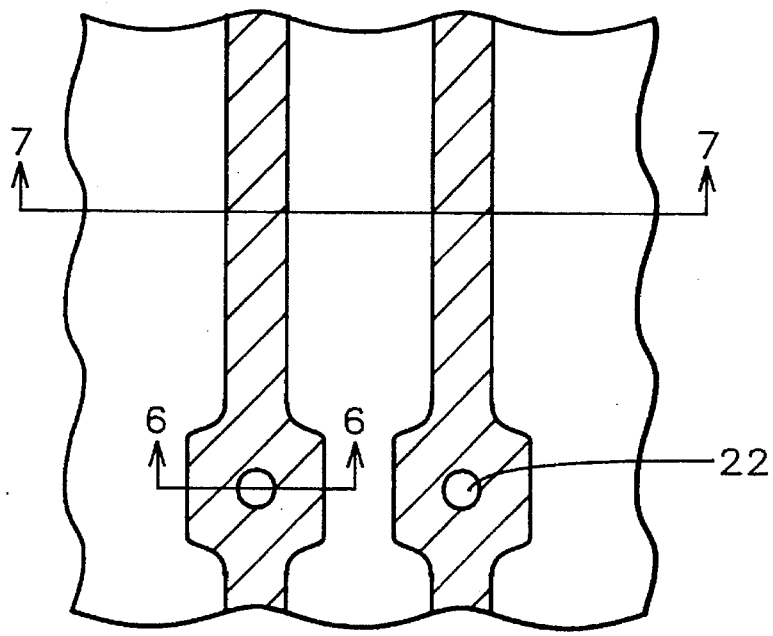
FIG. 4 schematically illustrates a top view of a metal mask of the present invention.

The "silo" mask 20, illustrated in FIG. 3, is a reversed tone modification of the mask of subsequent conducting layer used for etching the contact opening for the conducting layer and the shallow trench simultaneously (FIG. 4). Because of the reversed tone of metal mask used, the resulting contact profile is more sloped, improving the metal step coverage in the hole and therefore, obtaining a better contact electromigration, Furthermore, the subsequent conducting layer is partially buried within the dielectric layer, hence reducing the vertical height and therefore facilitating the planarization.

The "silo" mask illustrated in FIG. 3 is positioned over the semiconductor wafer. Using conventional photolithography techniques, the "silo" mask pattern is transferred to a photoresist layer, not shown. Using a wet or dry isotropic etch, the shallow trench 22, shown in FIG. 5, is etched. The shallow trench is etched wherever the final conducting layer is to be defined.

Figure 6A:
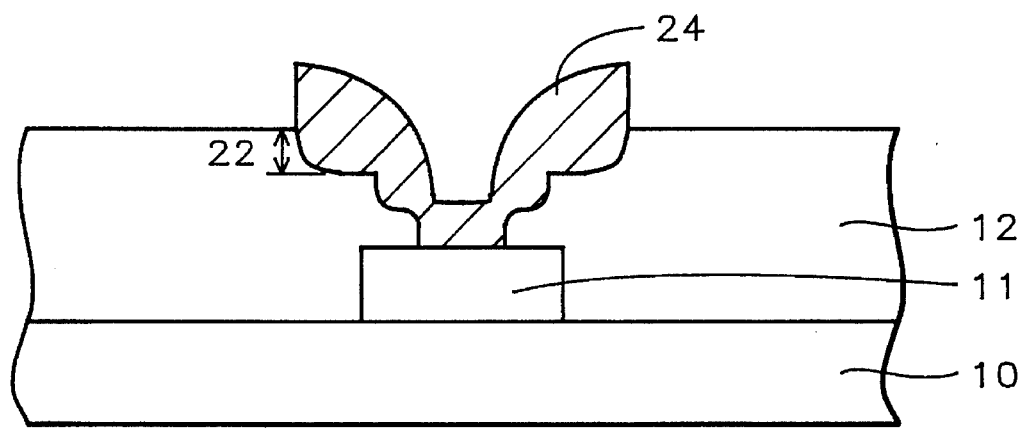
Figure 6B:
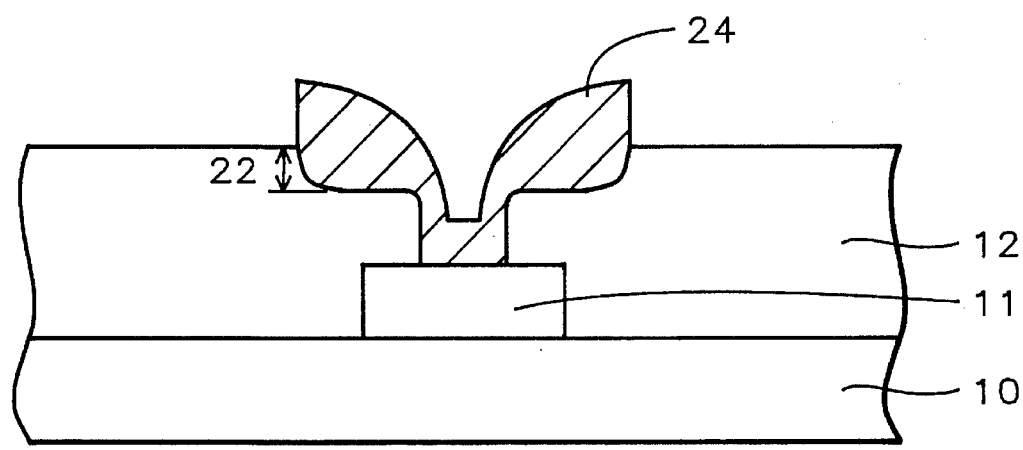

Next, using the regular conducting layer contact mask shown in FIG. 4, the pattern is transferred to a photoresist layer, not shown, and the contact openings are etched within the shallow trench and through the insulating layer 12 to the underlying semiconductor device structures. This etching may be an isotropic etch followed by an anisotropic etch producing a stepped profile of the contact opening, as shown in FIG. 6A. Alternatively, this etching may be a single anisotropic etching, as shown in FIG. 6B. As illustrated in FIGS. 6A and 6B, the conducting layer 24 is deposited and patterned. The conducting layer may be a metal or may be polysilicon or polycide. Because of the shallow trench, wider than the contact opening, the step coverage of the conducting layer is improved, especially for metal sputtering.

Figure 7:
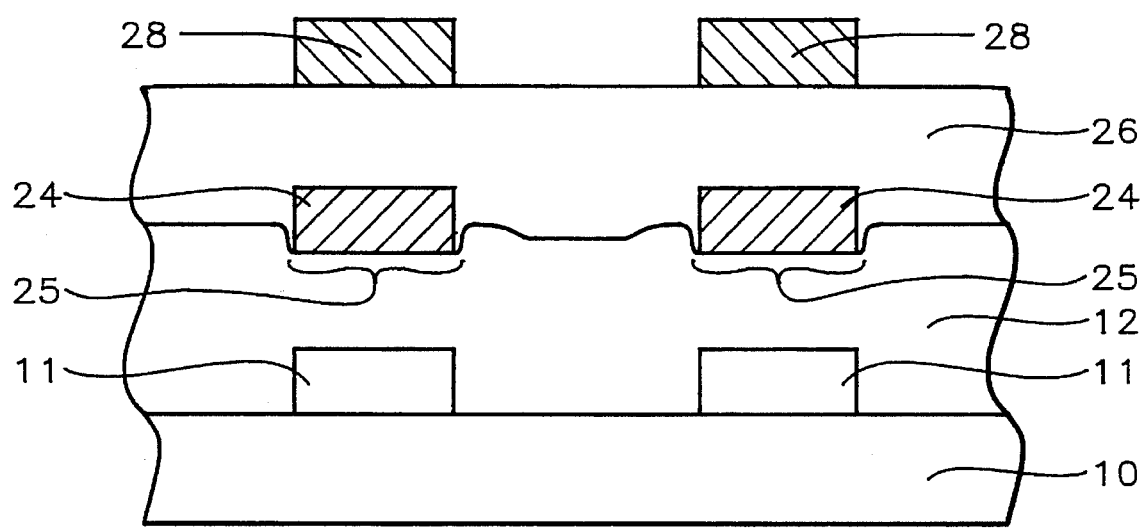

Referring now to FIG. 7 which corresponds to view 7—7 of the silo mask of FIG. 3, it can be seen that the conducting lines 24 are partially buried within the insulating layer 12. 25 illustrates the areas etched using the "silo" mask. Because of this, the topography of the conducting layer is reduced allowing for better planarization in the interlevel dielectric layer 26. The interlevel dielectric 26 may be spin-on-glass, $O_3$-TEOS, plasma enhanced (PE) oxide, PE TEOS, or other dielectric material. A second conducting layer 28 may be deposited and patterned. The same technique of partially burying the conducting layer 28 using the reversed tone metal mask can be used on this layer or on any subsequent layers.

While the invention has been particularly shown and described with reference to the preferred embodiments thereof, it will be understood by those skilled in the art that various changes in form and details may be made without departing from the spirit and scope of the invention.

What is claimed is:

1. A method of forming a conducting layer with improved step coverage and planarization in the fabrication of an integrated circuit comprising:

providing semiconductor device structures in and on a semiconductor substrate;

depositing an insulating layer overlying said semiconductor device structures;

etching a trench into said insulating layer where said conducting layer is to be deposited using a silo mask as a pattern;

etching through said insulating layer within said trench to said underlying semiconductor device structures to form a contact opening using a conducting layer mask as a pattern wherein said silo mask is a reversed tone copy of said conducting layer mask; and depositing said conducting layer overlying said insulating layer within said trench and within said contact opening wherein said conducting layer is partially buried within said insulating layer within said trench whereby planarization is improved because of the reduced step height of said conducting layer.

2. A method according to claim 1 wherein said semiconductor device structures include gate electrodes and source and drain regions.

3. A method according to claim 1 wherein said insulating layer is composed of borophosphosilicate glass and has a thickness of between about 5000 to 20,000 Angstroms.

4. A method according to claim 1 wherein said insulating layer is composed of spin-on-glass and has a thickness of between about 5000 and 20,000 Angstroms.

5. A method according to claim 1 wherein said insulating layer is composed of silicon oxide and has a thickness of between about 5000 and 20,000 Angstroms.

6. A method according to claim 1 wherein said trench is etched to a depth of between about 1000 and 5000 Angstroms.

7. A method according to claim 1 wherein said conducting layer is aluminum.

8. A method according to claim 1 wherein said conducting layer is tungsten.

9. A method according to claim 1 wherein said conducting layer is silicide.

10. A method according to claim 1 wherein said conducting layer is copper.

11. A method according to claim 1 wherein said conducting layer is polysilicon.

12. A method according to claim 1 wherein said conducting layer is polycide.

13. A method of forming a conducting layer with improved step coverage and planarization in the fabrication of an integrated circuit comprising:

providing semiconductor device structures in and on a semiconductor substrate;

depositing an insulating layer overlying said semiconductor device structures;

covering said insulating layer with a first photoresist layer and patterning said first photoresist layer using a silo mask wherein said silo mask is a reverse tone copy of a conducting layer mask to be used for patterning said conducting layer wherein said first photoresist layer is removed where said conducting layer is to be formed;

etching a trench into said insulating layer not covered by said first photoresist layer;

removing said first photoresist layer;

covering said insulating layer with a second photoresist layer and patterning said second photoresist layer with said conducting layer mask wherein said second photoresist layer is removed leaving an opening where said conducting layer is to be deposited and wherein said opening is within said trench and is narrower than said trench;

etching through said insulating layer not covered by said second photoresist layer to said underlying semiconductor device structures to form a contact opening;

removing said second photoresist layer; and depositing said conducting layer overlying said insulating layer within said trench and within said contact opening wherein said conducting layer is partially buried within said insulating layer within said trench whereby planarization is improved because of the reduced step height of said conducting layer.

14. A method according to claim 13 wherein said semiconductor device structures include gate electrodes and source and drain regions.

15. A method according to claim 13 wherein said insulating layer is composed of borophosphosilicate glass and has a thickness of between about 5000 to 20,000 Angstroms.

16. A method according to claim 13 wherein said insulating layer is composed of spin-on-glass and has a thickness of between about 5000 and 20,000 Angstroms.

17. A method according to claim 13 wherein said insulating layer is composed of silicon oxide and has a thickness of between about 5000 and 20,000 Angstroms.

18. A method according to claim 13 wherein said trench is etched to a depth of between about 1000 and 5000 Angstroms.

19. A method according to claim 13 wherein said conducting layer is aluminum.

20. A method according to claim 13 wherein said conducting layer is tungsten.

21. A method according to claim 13 wherein said conducting layer is silicide.

22. A method according to claim 13 wherein said conducting layer is copper.

23. A method according to claim 13 wherein said conducting layer is polysilicon.

24. A method according to claim 13 wherein said conducting layer is polycide.

25. The method according to claim 13 wherein said patterning of said second photoresist layer and said etching to form said contact opening are performed simultaneously.

26. The method according to claim 13 wherein said etching to form said contact opening comprises a first isotropic etch followed by a second anisotropic etch to form a contact opening having a stepped profile.

* * * * *